(12) United States Patent (10) Patent No.: US 8,815,698 B2
Yin et al. (45) Date of Patent: Aug. 26, 2014

(54) WELL REGION FORMATION METHOD AND SEMICONDUCTOR BASE

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN), `

( * ) Notice: Subject to any disclaimer, the term of this patent is extended or adjusted under 35 U.S.C. 154(b) by 230 days.

(21) Appl. No.: 13/381,636

(22) PCT Filed: Jul. 26, 2011

(86) PCT No.: PCT/CN2011/077634
§ 371 (c)(1), (2), (4) Date: Dec. 29, 2011

(87) PCT Pub. No.: WO2012/162934
PCT Pub. Date: Dec. 6, 2012

(65) Prior Publication Data
US 2012/0305941 A1 Dec. 6, 2012

(30) Foreign Application Priority Data
May 31, 2011 (CN) .......................... 2011 1 0144978

(51) Int. Cl.
*H01L 27/04* (2006.01)
*H01L 21/76* (2006.01)
*H01L 21/8238* (2006.01)
*H01L 29/16* (2006.01)
*H01L 21/8234* (2006.01)
*H01L 29/66* (2006.01)

(52) U.S. Cl.
CPC *H01L 21/823481* (2013.01); *H01L 21/823892* (2013.01); *H01L 21/823878* (2013.01); *H01L 29/1608* (2013.01); *H04L 29/161* (2013.01); *H01L 29/66651* (2013.01); *H01L 21/823493* (2013.01)
USPC ............. 438/400; 257/77; 257/371; 257/499; 257/506; 257/E21.54; 257/E21.63; 257/E21.644; 257/E27.01; 257/E27.067; 438/222; 438/223; 438/224

(58) Field of Classification Search
USPC ................... 257/371, 499, 506, 777, E21.54, 257/E21.63, E21.644, E27.01, E27.067; 438/222, 223, 224, 400
See application file for complete search history.

(56) References Cited

U.S. PATENT DOCUMENTS 6,569,742 B1 5/2003 Taniguchi et al.
6,576,512 B2 6/2003 Taniguchi et al.
(Continued)

FOREIGN PATENT DOCUMENTS

CN 1667816 A 9/2005

OTHER PUBLICATIONS

Int'l Search Report (Mar. 22, 2012).
(Continued)

*Primary Examiner* — Peniel M Gumedzoe
(74) *Attorney, Agent, or Firm* — Goodwin Procter LLP (57) ABSTRACT

A well region formation method and a semiconductor base in the field of semiconductor technology are provided. A method comprises: forming isolation regions in a semiconductor substrate to isolate active regions; selecting at least one of the active regions, and forming a first well region in the selected active region; forming a mask to cover the selected active region, and etching the rest of the active regions, so as to form grooves; and growing a semiconductor material by epitaxy to fill the grooves. Another method comprises: forming isolation regions in a semiconductor substrate for isolating active regions; forming well regions in the active regions; etching the active regions to form grooves, such that the grooves have a depth less than or equal to a depth of the well regions; and growing a semiconductor material by epitaxy to fill the grooves.

11 Claims, 9 Drawing Sheets

(56) References Cited

U.S. PATENT DOCUMENTS

| | | |
|---|---|---|
| 6,908,837 B2 | 6/2005 | Taniguchi et al. |
| 7,132,323 B2 | 11/2006 | Haensch et al. |
| 7,166,893 B2 | 1/2007 | Taniguchi et al. |
| 2003/0022434 A1 | 1/2003 | Taniguchi et al. |
| 2003/0022445 A1 | 1/2003 | Taniguchi et al. |
| 2003/0151109 A1 | 8/2003 | Taniguchi et al. |
| 2005/0106800 A1 | 5/2005 | Haensch et al. |
| 2006/0138568 A1 | 6/2006 | Taniguchi et al. |
| 2007/0181977 A1* | 8/2007 | Lochtefeld et al. ........... 257/618 |
| 2009/0159933 A1* | 6/2009 | Pinto et al. ................... 257/255 |

OTHER PUBLICATIONS

Written Opinion (Mar. 22, 2012).

* cited by examiner

WELL REGION FORMATION METHOD AND SEMICONDUCTOR BASE

This application is a National Phase application of, and claims priority to, PCT Application No. PCT/CN2011/077634, filed on Jul. 26, 2011 and entitled "WELL REGION FORMATION METHOD AND SEMICONDUCTOR BASE," which claimed priority to Chinese application No. 201110144978.1, filed on May 31, 2011. Both the PCT application and Chinese application are incorporated herein by reference in their entireties.

FIELD OF INVENTION

The present invention relates to the field of semiconductor technology, and particularly to a well region formation method and a semiconductor base.

BACKGROUND OF INVENTION

Well region formation is an indispensable process in semiconductor manufacturing.

A well region formation method I the prior art will be described with reference to the figures. The method comprises the following steps.

Figure 1:
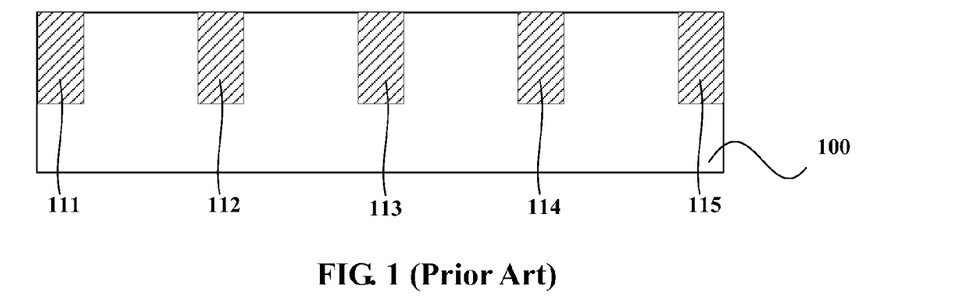
FIG. 1 to FIG. 6 illustrate a semiconductor device manufacturing method in the prior art with a structural diagram.

As shown in FIG. 1, a semiconductor substrate 100 is provided, and the semiconductor substrate 100 comprises: a first isolation structure 111, a second isolation structure 112, a third isolation structure 113, a fourth isolation structure 114 and a fifth isolation structure 115. The isolation structures are for isolating active regions.

Figure 2:
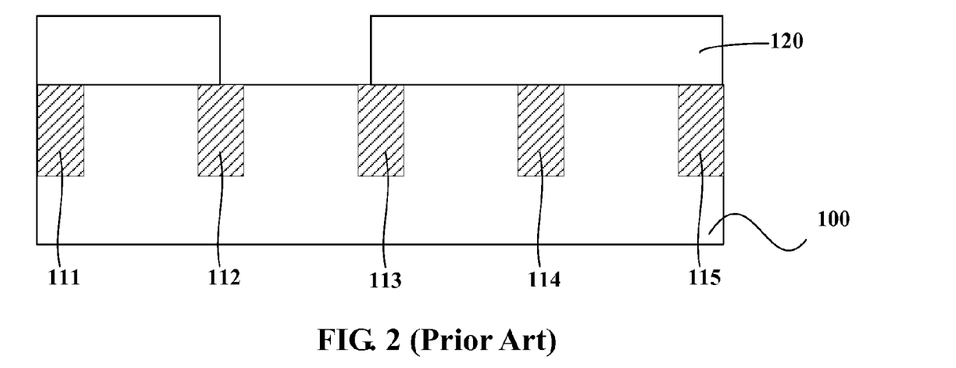

As shown in FIG. 2, a photoresist 120 is formed on the semiconductor substrate 100 outside an active region that is between the second isolation structure 112 and the third isolation structure 113.

Figure 3:
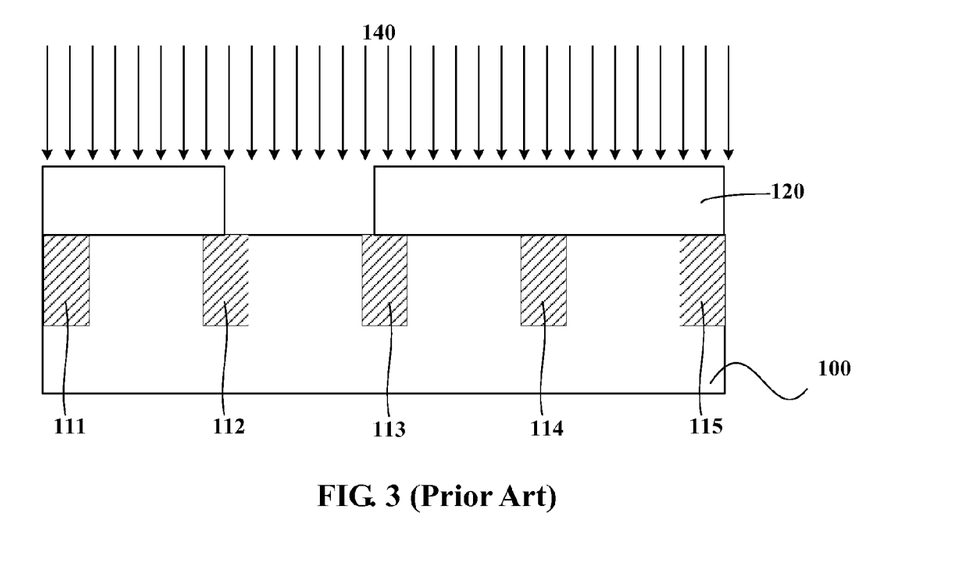

As shown in FIG. 3, implantation of dopant ions 140 is performed.

Figure 4:
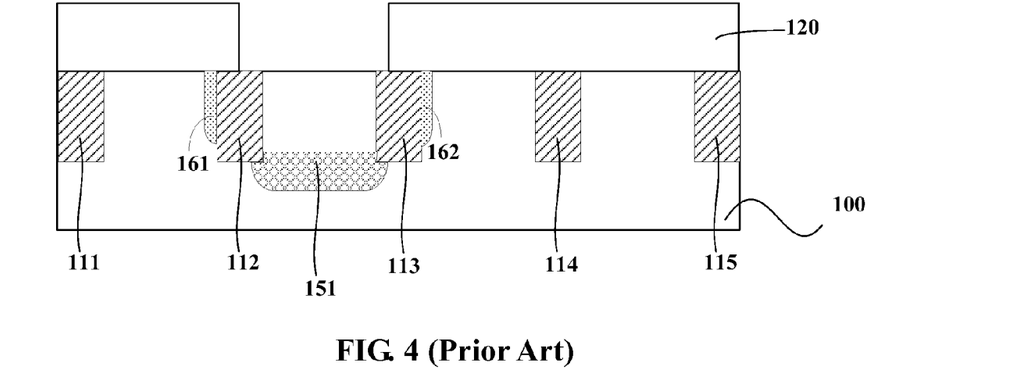

As shown in FIG. 4, a first well region 151 is formed in the active region between the second isolation region 112 and the third isolation structure 113, and the depth of the first well region 151 is generally greater than the depth of the isolation structures.

As semiconductor devices are scaled further, the isolation structures continue to shrink. Therefore, in the formation of the first well region 151. because of the small size of the isolation structures, lateral scattering of some of the dopant ions occurs, i.e., some of the dopant ions pass through the second isolation structure 112 and the third isolation structure 113, forming a first inadvertently doped area 161 along the upper and middle parts of a side of the second isolation structure 112 that faces the first isolation structure 111, as well as a second inadvertently doped area 162 along the upper and middle parts of a side of the third isolation structure 113 that faces the fourth isolation structure 114; and the first inadvertently doped area 161 and the second inadvertently doped area 162 both have a doping type the same as the first well region 151.

Figure 5:
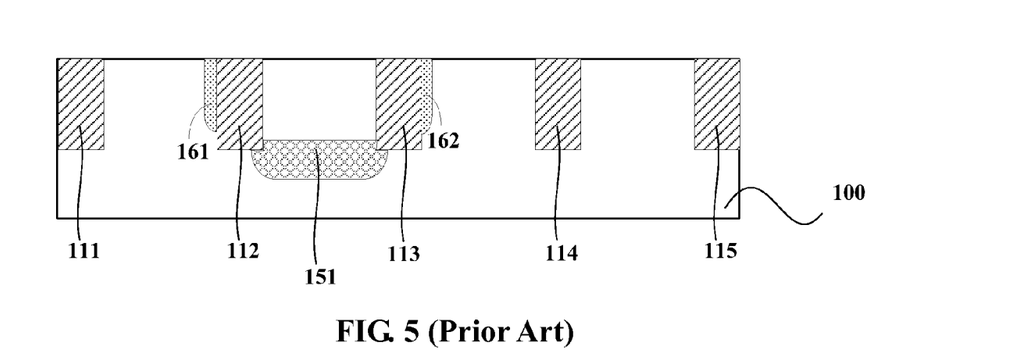

As shown in FIG. 5, the photoresist 120 is removed, and a semiconductor device comprising the first well region 151, the first inadvertently doped area 161 and the second inadvertently doped area 162 has been formed.

Figure 6:
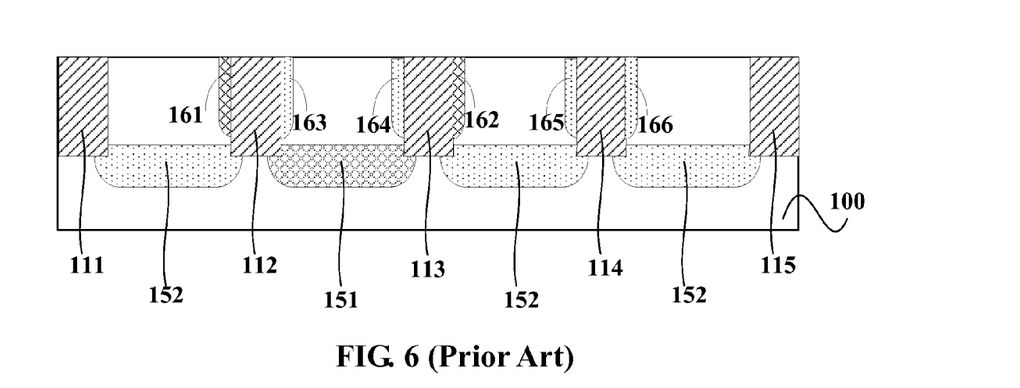

As shown in FIG. 6, by the same method, second well regions 152 are formed in an active region between the first isolation structure 111 and the second isolation structure 112, an active region between the third isolation structure 113 and the fourth isolation structure 114, and an active region between the fourth isolation structure 114 and the fifth isolation structure 115.

Similarly, in the formation of the second well regions 152, a third inadvertently doped area 163 is formed along the upper and middle parts of a side of the second isolation structure 112 facing the third isolation structure 113; a fourth inadvertently doped area 164 is formed along the upper and middle parts of a side of the third isolation structure 113 that faces the second isolation structure 112; a fifth inadvertently doped area 165 is formed along the upper and middle parts of a side of the fourth isolation structure 114 that faces the third isolation structure 113; and a sixth inadvertently doped area 166 is formed along the upper and middle parts of a side of the fourth isolation structure 114 that faces the fifth isolation structure 115. The third inadvertently doped area 163, the fourth inadvertently doped area 164, the fifth inadvertently doped area 165 and the sixth inadvertently doped area 166 all have a doping type the same as the second well region 152.

The doping type of the first well region 151 is different from that of the second well region 152. For example, the first well region 151 is N-type doped and the second well region 152 is P-type doped. Then, the first inadvertently doped area 161 and the second inadvertently doped area 162 are N-type doped, and the third inadvertently doped area 163, the fourth inadvertently doped area 164. the fifth inadvertently doped area 165, and the sixth inadvertently doped area 166 are P-type doped.

Because the fifth inadvertently doped area 165, the sixth inadvertently doped area 166 and the second well region 152 have the same doping type, the fifth inadvertently doped area 165 generally will not affect threshold voltage of the semiconductor device between the third isolation structure 113 and the fourth isolation structure 114, and the sixth inadvertently doped area 166 generally will not affect threshold voltage of the semiconductor device between the fourth isolation structure 114 and the fifth isolation structure 115.

However, the first inadvertently doped area 161 and the second well region 152 have different doping types, hence, threshold voltage of the semiconductor device between the first isolation structure 111 and the second isolation structure 112 will change. Similarly, because the third inadvertently doped area 163 and the first well region 151 have different doping types, and the fourth inadvertently doped area 164 and the first well region 151 have different doping types, threshold voltage of the semiconductor device between the second isolation structure 112 and the third isolation structure 113 will change; because the second inadvertently doped area 162 and the second well region 152 have different doping types, threshold voltage of the semiconductor device between the third isolation structure 113 and the fourth isolation structure 114 will change. Threshold voltage change will lead to affected performance of the semiconductor device.

Therefore, it is desired to reduce the threshold voltage change of the semiconductor device caused by lateral scattering of dopant ions in the formation of the well region.

SUMMARY OF INVENTION

A problem to be solved by the present invention is to provide a well region formation method and a semiconductor base, which can remove dopant ions laterally scattered through the isolation structure, and ensure stability of the threshold voltage of the semiconductor device.

To solve the problems above, according to the present invention, it is provided a well region formation method, comprising:

forming isolation regions in a semiconductor substrate to isolate active regions;

selecting at least one of the active regions, and forming a first well region in the selected active region;

forming a mask to cover the selected active region, and etching the rest of the active regions, so as to form grooves; and growing a semiconductor material by epitaxy to fill the grooves.

Optionally, the well region formation method further comprises: forming a second well region in the semiconductor material, the second well region having a doping type different from a doping type of the first well region.

Optionally, the material of the semiconductor substrate is the same as or different from the semiconductor material.

Optionally, the material of the semiconductor substrate and the semiconductor material both comprise Si, SiGe, SiC, or Ge.

Optionally, if the isolation regions are defined by isolation structures, the grooves have a depth less than or equal to a depth of the isolation structures.

To solve the problems above, according to the present invention, it is also provided a well region formation method, comprising:

forming isolation regions in a semiconductor substrate for isolating active regions;

forming well regions in the active regions;

etching the active regions to form grooves, such that the grooves have a depth less than or equal to a depth of the well regions; and growing a semiconductor material by epitaxy to fill the grooves.

Optionally, etching the active regions comprises: forming a mask on some of the active regions, and etching the rest of the active regions.

Optionally, the material of the semiconductor substrate is the same as or different from the semiconductor material.

Optionally, the well regions formed in the active regions comprise a first well region and a second well region, and the first well region and the second well region have different doping types.

Optionally, the material of the semiconductor substrate and the semiconductor material both comprise Si. SiGe. SiC, or Ge.

Optionally, if the isolation regions are defined by isolation structures, the grooves have a depth less than or equal to a depth of the isolation structures.

To solve the problems above, according to the present invention, it is also provided a semiconductor base, comprising:

a semiconductor substrate, which comprises an isolation structure for isolating at least two active regions;

a modified semiconductor region, wherein the modified semiconductor region is embedded in at least some of the active regions, the material of the modified semiconductor region is different from the material of the semiconductor substrate, and an upper surface of the modified semiconductor region is at least even with an upper surface of the active regions.

Optionally, a lower surface of the modified semiconductor region is higher than a lower surface of the isolation structure.

Optionally, the material of the semiconductor substrate comprises Si, SiGe, SiC, or Ge.

Optionally, the material of the modified semiconductor region comprises Si, SiGe, SiC, or Ge.

In comparison with the prior art, the present invention has following advantages.

1) According to an embodiment of the present invention, after a well region is formed in an active region, a mask is formed to cover the active region, and the semiconductor substrate containing inadvertently doped areas is removed, then, a semiconductor substrate without inadvertently doped areas is grown, thereby avoiding threshold voltage change of the semiconductor device caused by the inadvertently doped areas, and ensuring stability of the threshold voltage of the semiconductor device.

2) According to another embodiment of the present invention, after well regions are formed in active regions, the semiconductor substrate containing inadvertently doped areas is removed, without damaging the well regions, then, a semiconductor substrate without inadvertently doped areas is grown, thereby avoiding threshold voltage change of the semiconductor device caused by the inadvertently doped areas, and ensuring stability of the threshold voltage of the semiconductor device.

3) According to the present invention, it is also provided a semiconductor base, comprising a semiconductor substrate and a modified semiconductor region with different doping types. Because the semiconductor base has less or none of the inadvertently doped areas, stability oldie threshold voltage of the eventual semiconductor device can be ensured.

BRIEF DESCRIPTION OF DRAWINGS

The above and other objects, features and advantages of the present invention will become more apparent when read in conjunction with the accompanying drawings, in which the same reference numerals denote the same components. The figures are not drawn to scale, in order not to unnecessarily obscure the essence of the present invention.

DETAILED DESCRIPTION OF EMBODIMENTS

For a better understanding of the objects, features and advantages above of the present invention, the embodiments of the present invention will be described in details hereinafter with reference to the accompanying drawings.

In the following description, numerous specific details are set forth, in order to provide a thorough understanding of the present invention. It will be apparent to one skilled in the art that the present invention may be practiced without these specific details, hence, the present invention is not limited to the embodiments disclosed herein.

As discussed in the background of invention, in the prior art, as semiconductor devices are scaled further, in the formation of doped areas for those semiconductor devices comprising an isolation structure, some of the dopant ions pass through the isolation structure. resulting in lateral scattering, which may affect threshold voltage of the semiconductor device.

To solve the problems above, according to the present invention, two well region formation methods are provided: 1) after a well region is formed in an active region, a mask is formed to cover the active region, and the semiconductor substrate outside the active region and containing inadvertently doped areas is removed, then, a semiconductor substrate without inadvertently doped areas is grown; 2) after well regions are formed in active regions, the semiconductor substrate above some or all of the active regions and containing inadvertently doped areas is removed, without damaging the well regions, then, a semiconductor substrate without inadvertently doped areas is grown. Both of the methods above can avoid threshold voltage change of the semiconductor device caused by the inadvertently doped areas, and ensure stability of the threshold voltage of the semiconductor device. According to the methods above, a semiconductor base is also provided, comprising a semiconductor substrate and a modified semiconductor region with different doping types; because the semiconductor base has less or none of the inadvertently doped areas, stability of the threshold voltage of the eventual semiconductor device can be ensured.

Detailed descriptions are given below with reference to the drawings.

First Embodiment

Figure 7:
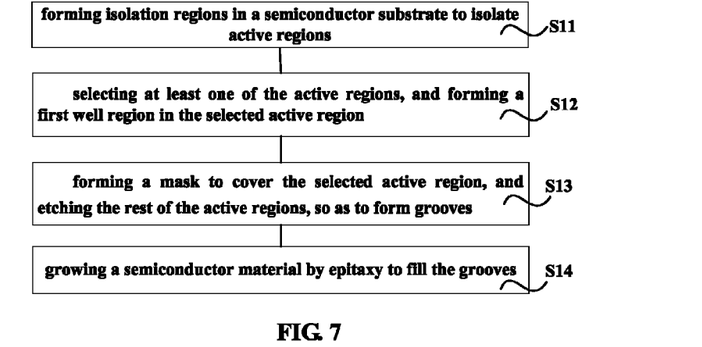
FIG. 7 is a flow chart of a well region formation method according to a first embodiment of the present invention.

FIG. 7 is a flow chart of a well region formation method according to a first embodiment of the present invention. The method comprises:

S11, forming isolation regions in a semiconductor substrate, for isolating active regions;

S12, selecting at least one of the active regions, and forming a first well region in the selected active region;

S13, forming a mask covering the selected active region, and etching the rest of the active regions, so as to form grooves; and S14, growing a semiconductor material by epitaxy to fill the grooves.

FIG. 8 to FIG. 16 illustrate a well region formation method according to the first embodiment of the present invention with a cross-sectional view of intermediate structures. The embodiment is described in details hereinafter with reference to FIG. 7, and FIG. 8 to FIG. 16.

Figure 8:
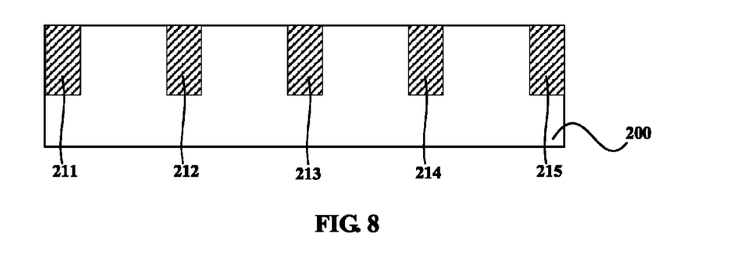
FIG. 8 to FIG. 16 illustrate a well region formation method according to the first embodiment of the present invention with a cross-sectional view of intermediate structures.

As shown in FIG. 7 and FIG. 8, step S11 is performed: isolation regions are formed in a semiconductor substrate 200, for isolating active regions.

Specifically, the semiconductor substrate 200 may be a silicon (Si) substrate, a silicon-germanium (SiGe) substrate, a silicon carbide (SiC) substrate or a germanium (Ge) substrate.

Specifically, the isolation regions may be defined by isolation structures; and the isolation structures may be a shallow trench isolation (STI) structure, or a LOCal Oxidation of Silicon (LOCOS) structure. The number of the isolation structures may be any integer larger than or equal to 2. The isolation structures may be manufactured with a conventional method, which is therefore omitted here.

For the sake of simplicity, the isolation structures in this embodiment are five, which are: a first shallow trench isolation structure 211, a second shallow trench isolation structure 212, a third shallow trench isolation structure 213, a fourth shallow trench isolation structure 214 and a fifth shallow trench isolation structure 215. A first active region is isolated by the first shallow trench isolation structure 211 and the second shallow trench isolation structure 212; a second active region is isolated by the second shallow trench isolation structure 212 and the third shallow trench isolation structure 213; a third active region is isolated by the third shallow trench isolation structure 213 and the fourth shallow trench isolation structure 214; and a fourth active region is isolated by the fourth shallow trench isolation structure 214 and the fifth shallow trench isolation structure 215.

Then, step S12 is performed: at least one of the active regions is selected, and a first well region is formed in the selected active region.

In this embodiment, the first active region, the second active region and the fourth active region are selected. It is noted that, different selections can be made in other embodiments of the present invention, for example, selecting one active region, two active regions or all of the active regions.

Figure 9:
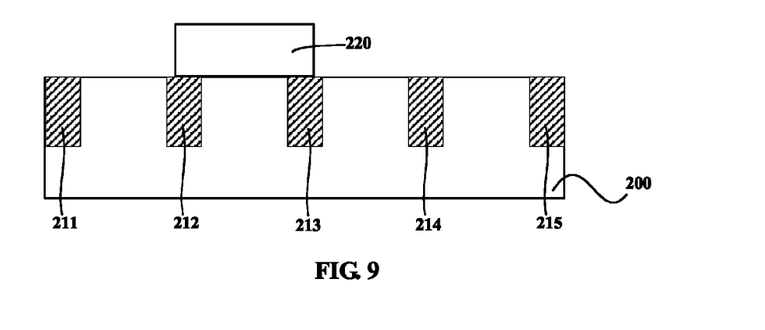

Firstly, a photoresist 220 may be formed on the unselected second active region, as shown in FIG. 9. The photoresist 220 may cover the second active region, a part or all of the second shallow trench isolation structure 212, and/or a part or all of the third shallow trench isolation structure 213. The photoresist 220 may cover only the second active region, as long as it does not cover the selected active regions.

Figure 10:
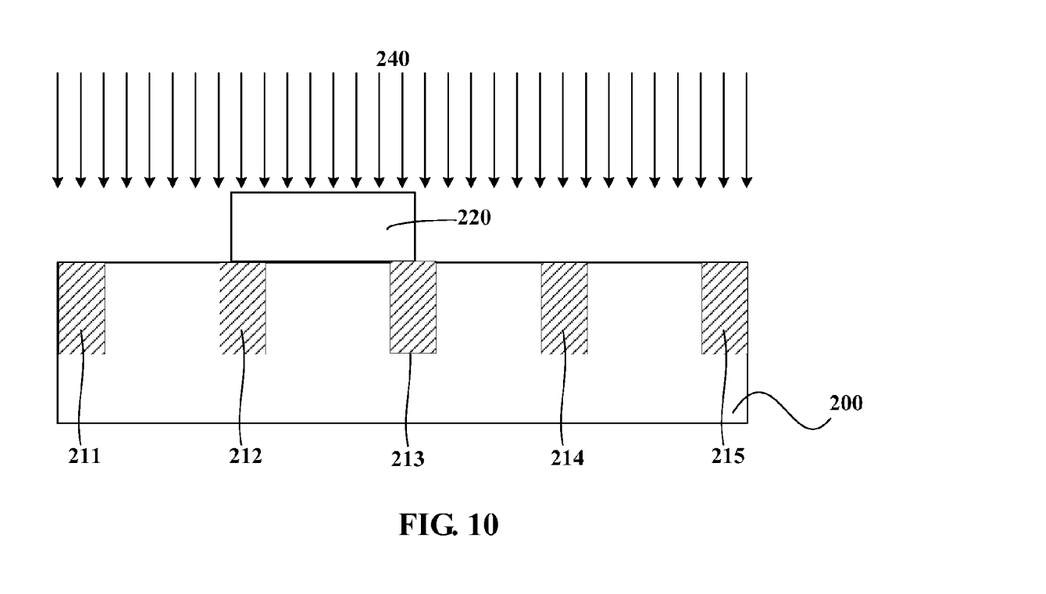

Then, implantation of dopant ions 240 may be performed, as shown in FIG. 10. If the first well regions are P-type doped, the dopant ions 240 may be In ions, B ions or $BF_2$ ions; and if the first well regions are N-type doped, the dopant ions 240 may be As ions, P ions or Sb ions.

Figure 11:
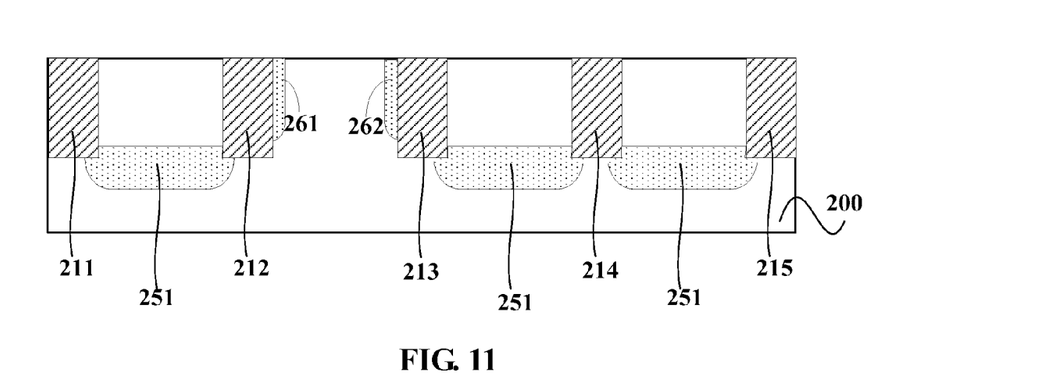

When dopant ions have been implanted, the photoresist 220 may be removed, resulting in first well regions 251 formed in the selected first active region, third active region and fourth active region, as shown in FIG. 11. Due to the reason described in the background of invention, in this embodiment, in the formation of the first well regions 251, a first inadvertently doped area 261 is formed along the upper and middle parts of a side of the second isolation structure 212 that faces the third isolation structure 213, and a second inadvertently doped area 262 is formed along the upper and middle parts of a side of the third isolation structure 213 that faces the second isolation structure 212, as shown in FIG. 11. As a matter of course, inadvertently doped areas may also be formed on the sides of the third isolation structure 213, the fourth isolation structure 214 and the second isolation structure 212, but are not shown in FIG. 11.

Then, step S13 is performed: a mask covering the selected first active region, third active region and fourth active region is formed, and the fourth active region, which is left, is etched, so as to form a groove.

Figure 12:
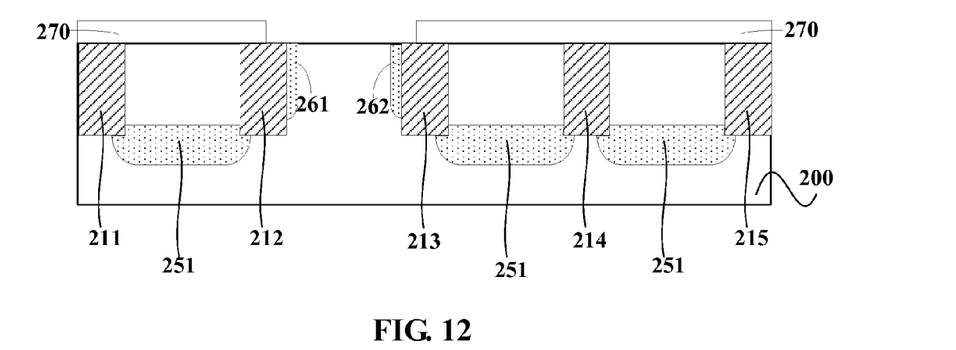

As shown in FIG. 12, firstly, a mask 270 may be formed on the first active region, the third active region and the fourth active region. The mask 270 may be obtained with any conventional vacuum deposition techniques, e.g., Atomic Layer Deposition (ALD), Physical Vapor Deposition (PVD). Chemical Vapor Deposition (CVD), or Plasma-Enhanced Chemical Vapor Deposition (PECVD). In this embodiment, Low-Pressure Chemical Vapor Deposition (LPCVD) is performed, at a high temperature (about 750 degrees Celsius), to produce silicon nitride ($Si_3N_4$) from ammonia gas and dichlorosilane.

It is noted that, while covering all of the three selected active regions, the mask 270 may also cover a part or all of the first shallow trench isolation structure 211, a part or all of the second shallow trench isolation structure 212, a part or all of the third shallow trench isolation structure 213, a part or all of the fourth shallow trench isolation structure 214, and/or a part or all of the fifth shallow trench isolation structure 215; but the mask 270 should not cover the unselected active region.

Figure 13:
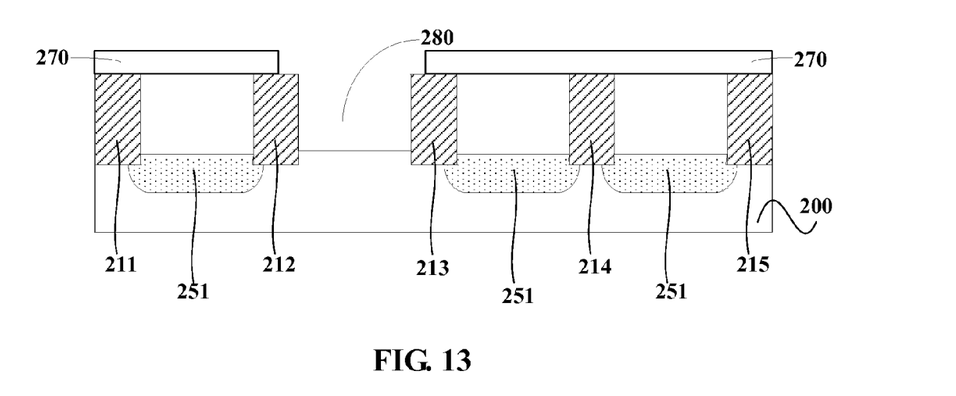

As shown in FIG. 13, the second active region, which is not covered by the mask 270, is selectively etched, so as to form a groove 280.

Specifically in this embodiment, the selective etching method may be selective plasma etching, which is known by those skilled in the art and therefore omitted here. In order to remove the first inadvertently doped area 261 and the second inadvertently doped area 262 in the process of forming the groove 280, the depth of the groove 280 should be larger than or equal to the depth of the first inadvertently doped area 261 or the depth of the second inadvertently doped area 262.

Furthermore, in order not to damage the shallow trench isolation structure, the depth of the groove 280 should also be less than or equal to the depth of the shallow trench isolation structure, as shown in FIG. 13. The upper surface of the well region is generally higher than the lower surface of the isolation structure, and the lower surface of the inadvertently doped area is lower than the upper surface of the well region, therefore, in the case where the depth of the groove 280 is set to be less than or equal to the depth of the isolation structure and larger than or equal to the depth of the first inadvertently doped area 261 or the second inadvertently doped area 262, the lower surface of the groove 280 may be higher than the upper surface of the first well region 251, or equal to than the upper surface of the first well region 251, or lower than the tipper surface of the first well region 251.

Figure 14:
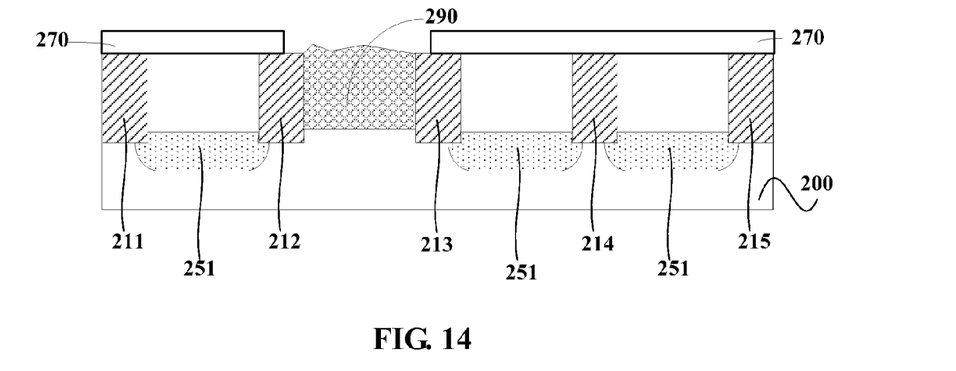

Then, step S14 is performed, as shown in FIG. 14, a semiconductor material 290 is grown by epitaxy to fill the groove 280 and form a modified semiconductor region.

The semiconductor material 290 grown by epitaxy may be Si, SiGe, SiC or Ge. The semiconductor material 290 may be the same as the material of the semiconductor substrate 200, or different from the material of the semiconductor substrate 200.

The epitaxial growth method may be selective epitaxial growth, i.e., the semiconductor material 290 is grown only in the groove 280. This method is known by those skilled in the art, and is therefore omitted here.

Figure 15:
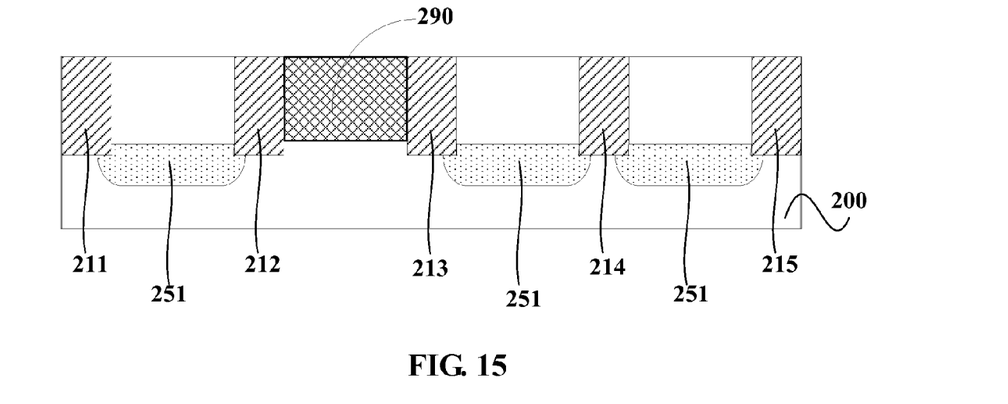

As shown in FIG. 15, subsequently in this embodiment, the mask may be removed by a wet or dry etching method, and planarization (e.g., Chemical Mechanical Polishing) may be performed on the semiconductor material 290, so that the upper surface of the semiconductor material 290 in the groove 280 is even with the upper surface of the tipper surface of the shallow trench isolation structure, resulting in a modified semiconductor region which fills up the groove 208 with the semiconductor material 290. The term "even" may mean that the two lie in exactly the same plane, or may allow some variations within a permitted range for technological parameters.

Figure 16:
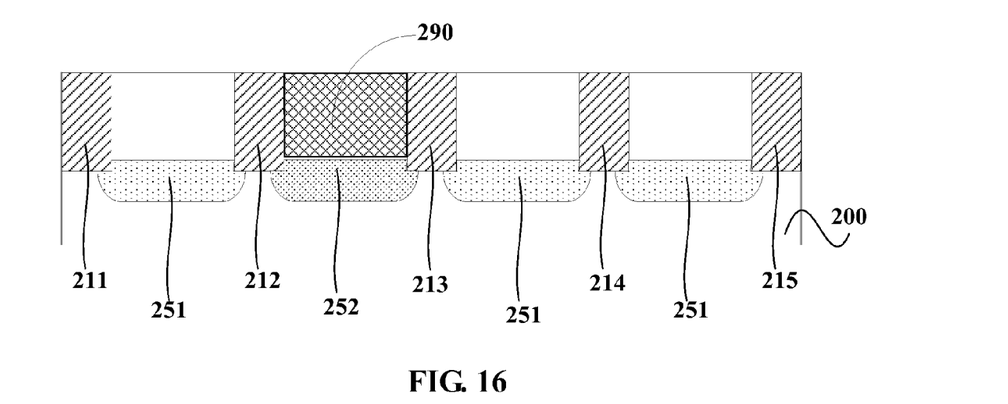

Furthermore, as shown in FIG. 16, this embodiment may include forming a second region 252 in the semiconductor material 290, i.e., a second region 252 is formed in the unselected second active region. The doping type of the second well region 252 may be different from the doping type of the first regions 251, i.e., if the first well region 251 is N-type doped, then the second well region 252 is P-type doped; and if the first well region 251 is P-type doped, then the second well region 252 is N-type doped. Please refer to step S 12 for the method for forming the second well region, which is omitted here.

Thus, the first well regions 251 and the second well region 252 have been formed.

In this embodiment, in the formation of the first well regions 251, the first inadvertently doped area 261 and the second inadvertently doped area 262, which have a doping type different from the doping type of the second well region 252, are removed, so that threshold voltage of the semiconductor device formed on the second well region 252 will not be affected by lateral scattering of dopant ions, thereby ensuring stability of the performance.

Second Embodiment

Figure 17:
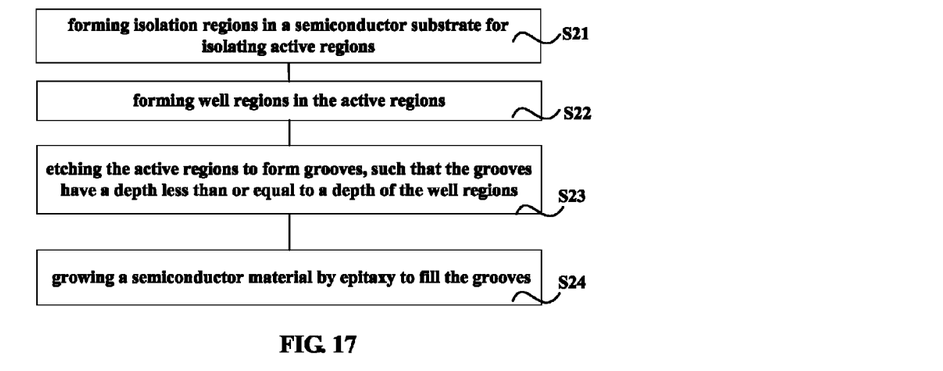
FIG. 17 is a flow chart of a well region formation method according to a second embodiment oldie present invention.

FIG. 17 is a flow chart of a well region formation method according to a second embodiment of the present invention. The method comprises:

S21, forming isolation regions in a semiconductor substrate, for isolating active regions;

S22, forming well regions in the active regions;

S23, etching the active regions to form grooves, such that the grooves have a depth less than or equal to a depth of the well regions; and S24, growing a semiconductor material by epitaxy to fill the grooves.

Step S21 in this embodiment is the same as step S11 in the first embodiment, and step S24 in this embodiment is the same as step S14 in the first embodiment. The differences between this embodiment and the first embodiment lie in step S22 and step S23, which are described in details hereinafter.

Figure 18:
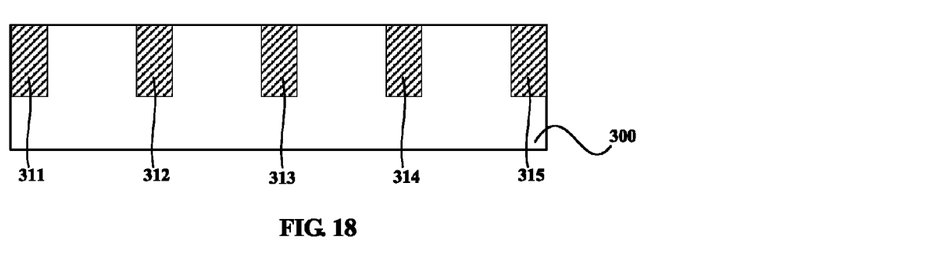
FIG. 18 to FIG. 22 illustrate a well region formation method according to the second embodiment of the present invention with a cross-sectional view of intermediate structures.

Firstly, step S21 is performed, as shown in FIG. 18. In this embodiment, five shallow trench isolation structures are formed in the semiconductor substrate 310, for isolating four active regions.

Step S21 in this embodiment is the same as step 11 in the first embodiment, resulting in a first shallow trench isolation structure 311, a second shallow trench isolation structure 312, a third shallow trench isolation structure 313, a fourth shallow trench isolation structure 314 and a fifth shallow trench isolation structure 315. A first active region is isolated by the first shallow trench isolation structure 311 and the second shallow trench isolation structure 312; a second active region is isolated by the second shallow trench isolation structure 312 and the third shallow trench isolation structure 313; a third active region is isolated by the third shallow trench isolation structure 313 and the fourth shallow trench isolation structure 314; and a fourth active region is isolated by the fourth shallow trench isolation structure 314 and the fifth shallow trench isolation structure 315.

Figure 19:
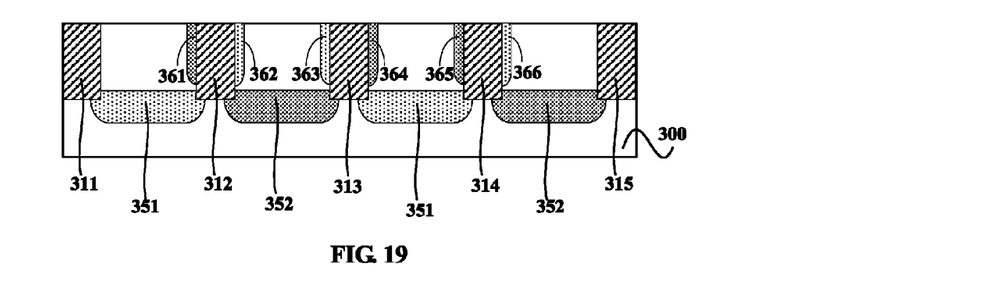

Then, step S22 is performed, as shown in FIG. 19, first well regions 351 are formed in the first active region and the third active region, second well regions 352 are formed in the second active region and the fourth active region, and the first well regions 351 and the second well regions 352 have different doping types. This is merely an example. and should not be interpreted as limiting the scope of the invention. In other embodiments of the present invention, a first well region 351 or a second well region 352 may be formed in each of the active regions; alternatively, a first well region 351 may be formed in one of the active regions, and a second well region 352 may be formed in each of the rest of the active regions. The actual situation may be determined according to the requirements of the eventual semiconductor device.

Specifically, the methods for forming the first well regions 351 and the second well regions 352 are the same as those in the first embodiment, which are omitted here. The depth of the first well regions may be the same as or different from the depth of the second well regions. The depth of a well region refers to the vertical distance between the upper surface of the well region and the upper surface of the shallow trench isolation structure.

Again, with reference to FIG. 19, due to the reason described in the background of invention, in the formation of the first well regions 351 and the second well regions 352, a first inadvertently doped area 361 is formed along the upper and middle parts of a side of the second shallow trench isolation structure 312 that faces the first shallow trench isolation structure 311; a second inadvertently doped area 362 is formed along the upper and middle parts of a side of the second shallow trench isolation structure 312 that faces the third shallow trench isolation structure 313; a third inadvertently doped area 363 is formed along the upper and middle parts of a side of the third shallow trench isolation structure 313 that faces the second shallow trench isolation structure 312; a fourth inadvertently doped area 364 is formed along the upper and middle parts of a side of the third shallow trench isolation structure 313 that faces the fourth shallow trench isolation structure 314; a fifth inadvertently doped area 365 is formed along the upper and middle parts of a side of the fourth shallow trench isolation structure 314 that faces the third shallow trench isolation structure 313; and a sixth inadvertently doped area 366 is formed along the upper and middle parts of a side of the fourth shallow trench isolation structure 314 that faces the fifth shallow trench isolation structure 315. And the first inadvertently doped area 361 and the fourth inadvertently doped area 364 and the fifth inadvertently doped area 365 all have a doping type the same as the second well regions 352; and the second inadvertently doped area 362 and the third inadvertently doped area 363 and the six inadvertently doped area 366 all have a doping type the same as the first well regions 351.

Figure 20:
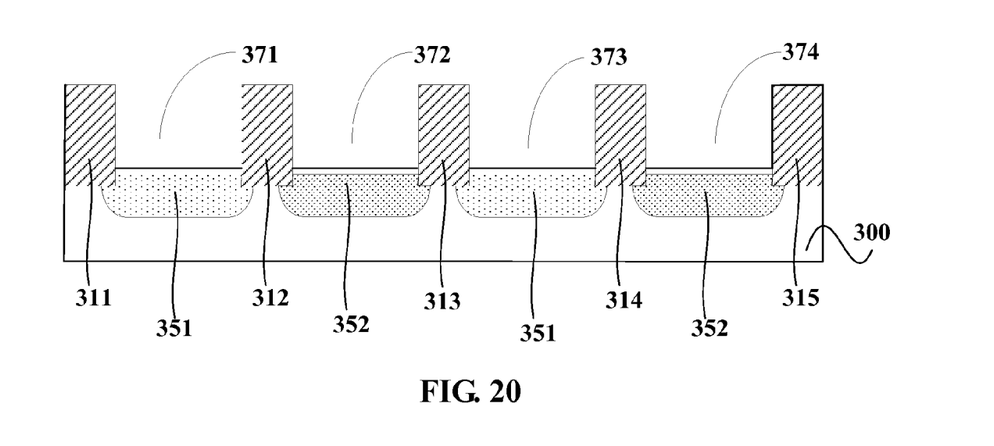

Then, step S23 is performed, as shown in FIG. 20, each of the active regions is etched to form a first groove 371, a second groove 372, a third groove 373 and a fourth groove 374, such that the depth of each of the groove is less than or equal to the depth of the corresponding well region. The depth of a groove refers to the vertical distance between the upper surface of the groove and the upper surface of the shallow trench isolation structure.

In this embodiment, in order not to damage the structures of the first well regions 351 and the second devices 352, the depth of each of the grooves should be less than or equal to the depth of the corresponding well region. The grooves may be formed with an etching method the same as that in the first embodiment, which are therefore omitted here.

Furthermore, in order not to damage the shallow trench isolation structures, the depth of the groove should also be less than or equal to the depth of the shallow trench isolation structure, as shown in FIG. 20.

Figure 21:
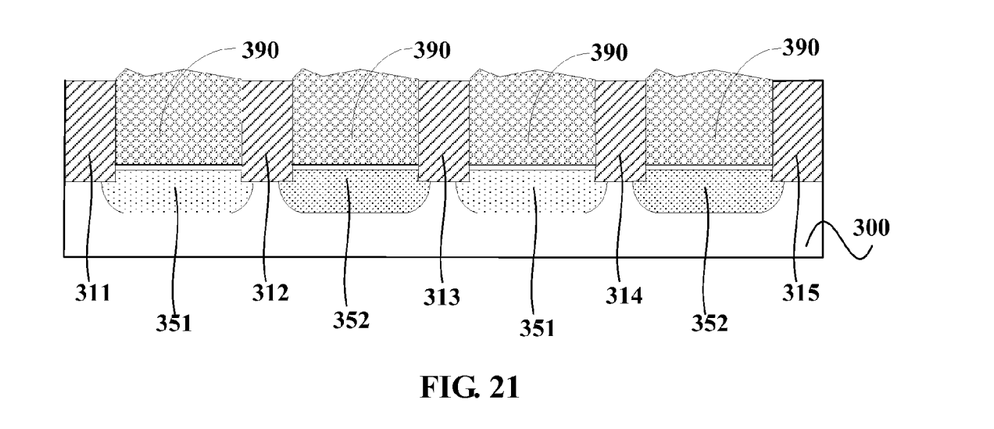

Finally, step S24 is performed, as shown in FIG. 21, a semiconductor material 390 is grown by epitaxy to till each of the grooves and form a modified semiconductor region.

Figure 22:
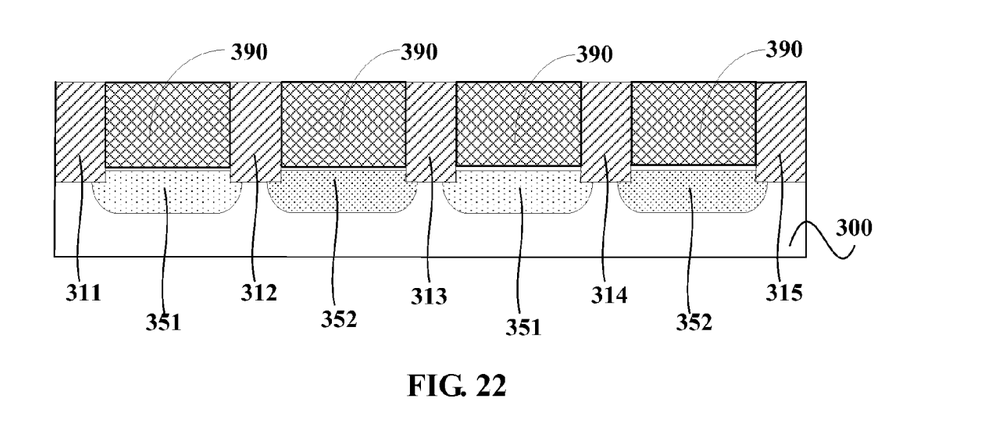

As shown in FIG. 22, the embodiment may further include planarization of the semiconductor material 390.

Specifically, the semiconductor material 390 grown by epitaxy may be Si, SiGe, SiC or Ge. The semiconductor material 390 may be the same as the material of the semiconductor substrate 300. or different from the material of the semiconductor substrate 300.

The planarization of the semiconductor material 390 in the grooves in this embodiment may he performed by a method the same as that in the first embodiment, which is therefore omitted here.

In the embodiment, after the first well regions 351 and the second well regions 352 are formed, all of the semiconductor substrate containing inadvertently doped areas is etched collectively, without the presence of a mask, and without damaging the formed well region structures, then, a semiconductor substrate comprising the well regions but the inadvertently doped areas is grown on the etched regions by epitaxy. Subsequently, when the semiconductor devices have been formed, all of the semiconductor devices will not be affected by lateral scattering of dopant ions. Therefore, the method in this embodiment is simple, costs less, and can ensure stability of the threshold voltage of all the semiconductor devices.

In another embodiment of the present invention, after the well regions are formed in the active regions, a mask is formed on some of well regions so that selective etching can be performed on the rest of the well regions to form grooves, with the depth of each of the grooves being less than the depth of a corresponding well region; then, a semiconductor material is grown by epitaxy to fill all the grooves; finally, the mask is removed. This embodiment can realize the removal of some of the inadvertently doped areas corresponding to some of the well regions, and prevent threshold voltage change of the corresponding semiconductor devices caused by lateral scattering of the portion of inadvertently doped areas.

Third Embodiment

Figure 23:
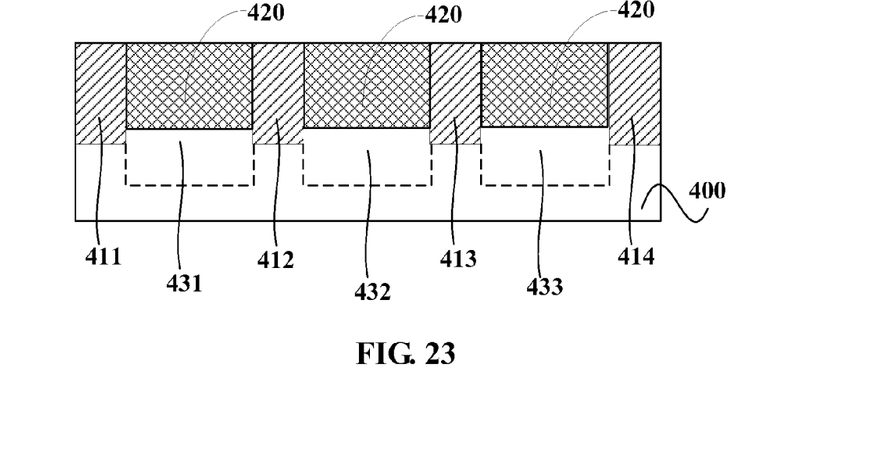
FIG. 23 is a structural diagram of a semiconductor base according to a third embodiment of the present invention.

As shown in FIG. 23, according to the embodiment, it is provided a semiconductor base, comprising:

a semiconductor substrate 400, the semiconductor substrate 400 comprising a isolation structure for isolating active regions;

a modified semiconductor region 420 formed according to an embodiment above, wherein the modified semiconductor region 420 is embedded in at least some of the active regions, the material of the modified semiconductor region 420 is different from the material of the semiconductor substrate 400, and an upper surface of the modified semiconductor region 420 is at least even with an upper surface of the active region.

The material of the semiconductor substrate 400 in this embodiment may be Si, SiGe, SiC or Ge.

For illustrative purposes, in an embodiment, as shown in FIG. 23, the semiconductor substrate comprises a first isolation structure 411, a second isolation structure 412, a third isolation structure 413 and a fourth isolation structure 414, for isolating a first active region 431, a second active region 432 and a third active region 433, and the isolation structures all are shallow trench isolation structures. It is noted that. in other embodiments of the present invention, the number of the isolation structures may be any integer larger than 2, and the isolation structures may be other isolation structures, e.g., local oxidation of silicon structure.

Specifically, first well regions (not shown) may be formed in the at least some of the active regions, second well regions (not shown) may be formed in the rest of the active regions, and the doping type of the first well II regions is different from that of the second regions. and the upper surface of the first well regions and the upper surface of the second well regions are lower than or even with the lower surface of the modified semiconductor region 420.

In this embodiment, the material of the modified semiconductor region 420 may be Si, SiGe, SiC or Ge, but the material of the modified semiconductor region 420 is different from the material of the semiconductor substrate 400. For example. if the material of the semiconductor substrate 400 is Si, the material of the modified semiconductor region 420 may be SiGe, SiC or Ge, except Si.

In the embodiment of the present invention, the lower surface of the modified semiconductor region 420 is higher than the lower surface of the isolation structure, preventing damages to the well regions formed between the isolation structures.

In the embodiment, the modified semiconductor region 420 is embedded in each of the active regions. In other embodiments of the present invention, the modified semiconductor region 420 may he embedded in only some of the active regions, and in the rest of the active regions remains the semiconductor substrate. the material of which is different from that of the modified semiconductor region 420.

In the embodiment, the upper surface of the modified semiconductor region 420 is even with the upper surface of the active region. In other embodiments of the present invention, the upper surface of the modified semiconductor region 420 may be higher than the upper surface of the active region.

The semiconductor base above may be formed by a method according to the first embodiment or the second embodiment, so that some or all of the inadvertently doped areas in the semiconductor base can be removed, ensuring stability of the threshold voltage of the corresponding semiconductor devices.

Preferred embodiments of the invention are disclosed above, which should not be interpreted as limiting the scope of the invention. Alternations and modifications can be made to the technical solution of the invention by those skilled in the art without deviation from the scope of the invention. Therefore, the scope of the invention should be defined by the claims attached.

The invention claimed is:

1. A well region formation method, comprising:
   forming isolation regions in a semiconductor substrate to isolate active regions;
   selecting at least one of the active regions, and forming a first well region in the selected active region,
   wherein the well region formation method further comprises:
   forming a mask to cover the selected active region, and etching the rest of the active regions, so as to form grooves; and
   growing a semiconductor material by epitaxy to fill the grooves.

2. The well region formation method according to claim 1, further comprising:
   forming a second well region in the semiconductor material, the second well region having a doping type different from a doping type of the first well region.

3. The well region formation method according to claim 1, wherein the material of the semiconductor substrate is the same as or different from the semiconductor material.

4. The well region formation method according to claim 3, wherein the material of the semiconductor substrate and the semiconductor material both comprise Si, SiGe, SiC, or Ge.

5. The well region formation method according to claim 1, wherein if the isolation regions are defined by isolation structures, the grooves have a depth less than or equal to a depth of the isolation structures.

6. A well region formation method, comprising:
   forming isolation regions in a semiconductor substrate for isolating active regions;
   forming well regions in the active regions,
   wherein the well region formation method further comprises:
   etching the active regions to form grooves, such that the grooves have a depth less than or equal to a depth of the well regions; and
   growing a semiconductor material by epitaxy to fill the grooves.

7. The well region formation method according to claim 6, wherein etching the active regions comprises: forming a mask on some of the active regions, and etching the rest of the active regions.

8. The well region formation method according to claim 6, wherein the material of the semiconductor substrate is the same as or different from the semiconductor material.

9. The well region formation method according to claim 6, wherein the well regions formed in the active regions comprise a first well region and a second well region, and the first well region and the second well region have different doping types.

10. The well region formation method according to claim 6, wherein the material of the semiconductor substrate and the semiconductor material both comprise Si, SiGe, SiC, or Ge.

11. The well region formation method according to claim 6, wherein if the isolation regions are defined by isolation structures, the grooves have a depth less than or equal to a depth of the isolation structures.

* * * * *